(12) United States Patent
Masuoka et al.

(10) Patent No.: US 9,024,376 B2
(45) Date of Patent: May 5, 2015

(54) VERTICAL TRANSISTOR WITH DIELECTRICALLY-ISOLATED WORK-FUNCTION METAL ELECTRODES SURROUNDING THE SEMICONDUCTOR PILLAR

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 0 days.

(21) Appl. No.: 14/160,788

(22) Filed: Jan. 22, 2014

(65) Prior Publication Data

US 2014/0209998 A1 Jul. 31, 2014

Related U.S. Application Data

(60) Provisional application No. 61/756,677, filed on Jan. 25, 2013.

(51) Int. Cl.
*H01L 29/423* (2006.01)
*H01L 29/78* (2006.01)

(52) U.S. Cl.
CPC ...... *H01L 29/42392* (2013.01); *H01L 29/7827* (2013.01)

(58) Field of Classification Search
CPC .................. H01L 29/42392; H01L 29/7827; H01L 29/66
See application file for complete search history.

(56) References Cited

U.S. PATENT DOCUMENTS

| 7,115,476 B1 * | 10/2006 | Izumida ..................... 438/268 |
| 7,948,050 B2 * | 5/2011 | Appenzeller et al. ......... 257/463 |
| 2004/0262681 A1 | 12/2004 | Masuoka et al. |
| 2008/0173933 A1 | 7/2008 | Fukuzumi et al. |
| 2010/0301402 A1 * | 12/2010 | Masuoka et al. ............... 257/288 |
| 2011/0121396 A1 * | 5/2011 | Lee .................. 257/365 |
| 2013/0240983 A1 * | 9/2013 | Larrieu ....................... 257/329 |

FOREIGN PATENT DOCUMENTS

| JP | H02-071556 | 3/1990 |
| JP | H02-188966 | 7/1990 |
| JP | H03-145761 | 6/1991 |

(Continued)

OTHER PUBLICATIONS

International Search Report for PCT/JP2013/051599 dated Feb. 26, 2013, 2 pages.

*Primary Examiner* — Marc Armand
*Assistant Examiner* — Younes Boulghassoul
(74) *Attorney, Agent, or Firm* — Brinks Gilson & Lione

(57) ABSTRACT

A semiconductor device includes a pillar-shaped semiconductor having an impurity concentration of $10^{17}$ cm$^{-3}$ or less, a first insulator that surrounds the pillar-shaped semiconductor, a first metal that surrounds a portion of the first insulator at a first end of the pillar-shaped semiconductor, a second metal that surrounds a portion of the first insulator at the second end of the pillar-shaped semiconductor, a third metal that surrounds a portion of the first insulator in a region sandwiched between the first metal and the second metal, a second insulator formed between the first and third metals, a third insulator formed between the second and third metals, a fourth metal that connects the first metal and the one end, and a fifth metal that connects the second metal and the other end. The third metal has a work function of about 4.2 eV to about 5.0 eV.

10 Claims, 3 Drawing Sheets

(56) References Cited

FOREIGN PATENT DOCUMENTS

| | | |
|---|---|---|
| JP | H11-297984 | 10/1999 |
| JP | 2004-356314 | 12/2004 |
| JP | 2008-172164 | 7/2008 |
| JP | 2012-004473 | 1/2012 |

* cited by examiner

VERTICAL TRANSISTOR WITH DIELECTRICALLY-ISOLATED WORK-FUNCTION METAL ELECTRODES SURROUNDING THE SEMICONDUCTOR PILLAR

CROSS REFERENCES TO RELATED APPLICATIONS

Pursuant to 35 U.S.C.§119(e), this application claims the benefit of the filing date of Provisional U.S. Patent Application Ser. No. 61/756,677 filed on Jan. 25, 2013. The entire content of this application is hereby incorporated by reference.

BACKGROUND

1. Technical Field

The present disclosure relates to a method for producing a semiconductor device and a semiconductor device.

2. Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as "SGT") having a structure in which a source, a gate, and a drain are arranged vertically with respect to a substrate and a gate electrode surrounds a pillar-shaped semiconductor layer has been proposed (See for example, Japanese Unexamined Patent Application Publication Nos. 2-71556, 2-188966, and 3-145761).

As the width of a silicon pillar decreases, it becomes more difficult to make an impurity be present in the silicon pillar because the density of silicon is $5 \times 10^{22}/cm^3$.

It has been proposed in known SGTs that the channel concentration is decreased to be a low impurity concentration of $10^{17}$ cm$^{-3}$ or less and a threshold voltage is determined by changing the work function of a gate material (See for example, Japanese Unexamined Patent Application Publication No. 2004-356314).

It is disclosed that, in planar MOS transistors, the sidewall of an LDD region is formed of a polycrystalline silicon having the same conductivity type as a low-concentration layer, surface carriers of the LDD region are induced by the difference in work function, and thus the impedance of the LDD region can be reduced compared with LDD MOS transistors with an oxide film sidewall (See for example, refer to Japanese Unexamined Patent Application Publication No. 11-297984). It is also disclosed that the polycrystalline silicon sidewall is electrically insulated from a gate electrode. The drawings show that the polycrystalline silicon sidewall is insulated from a source and a drain by an interlayer insulating film.

BRIEF SUMMARY

It is an object of the disclosure to provide an SGT having a structure in which a transistor is formed by using a difference in the work function between a metal and a semiconductor.

A semiconductor device according to an aspect of the disclosure includes a pillar-shaped semiconductor having an impurity concentration of $10^{17}$ cm$^{-3}$ or less, a first insulator that surrounds the pillar-shaped semiconductor, a first metal that surrounds a portion of the first insulator at a first end of the pillar-shaped semiconductor, a second metal that surrounds a portion of the first insulator at a second end of the pillar-shaped semiconductor, a third metal that surrounds a portion of the first insulator in a region sandwiched between the first metal and the second metal, a second insulator formed between the first metal and the third metal, a third insulator formed between the second metal and the third metal, a fourth metal that connects the first metal and the first end of the pillar-shaped semiconductor, and a fifth metal that connects the second metal and the second end of the pillar-shaped semiconductor, wherein the third metal has a work function of 4.2 eV to 5.0 eV.

The semiconductor may be silicon.

The first metal and the second metal may have a work function of 4.0 eV to 4.2 eV.

The first metal and the second metal may have a work function of 5.0 eV to 5.2 eV.

According to the present disclosure, there can be provided an SGT having a structure in which a transistor is formed by using a difference in work function between metal and silicon.

Carriers are induced by a difference in work function between metal and silicon because of the presence of a first metal that surrounds a portion of a first insulator at a first end of a pillar-shaped silicon and a second metal that surrounds a portion of the first insulator at a second end of the pillar-shaped silicon. Therefore, when the first metal and the second metal have a work function of 4.0 eV to 4.2 eV, an n-type transistor is provided. When the first metal and the second metal have a work function of 5.0 eV to 5.2 eV, a p-type transistor is provided. This enables transistor operation despite the lack of an impurity in a pillar-shaped silicon. Accordingly, impurity implantation for forming a diffusion layer is not necessary.

A semiconductor device according to an aspect of the present disclosure includes a pillar-shaped semiconductor, a first insulator surrounding the pillar-shaped semiconductor, a first metal surrounding a portion of the first insulator at a first end of the pillar-shaped semiconductor, a second metal surrounding a portion of the first insulator at a second end of the pillar-shaped semiconductor, a third metal surrounding a portion of the first insulator in a region sandwiched between the first metal and the second metal, a second insulator between the first metal and the third metal, a third insulator between the second metal and the third metal, a fourth metal connecting the first metal and the first end of the pillar-shaped semiconductor, and a fifth metal connecting the second metal and the second end of the pillar-shaped semiconductor.

Charge carriers are induced at the first end of the pillar-shaped semiconductor by a difference in the work function between the pillar-shaped semiconductor and the first metal, and charge carriers are induced at the other end of the pillar-shaped semiconductor by a difference in the work function between the pillar-shaped semiconductor and the second metal.

In a further aspect of the disclosure, it is not necessary that the metals and insulators surround a portion the underlying structure. The disclosed device can be realized where the metal or insulator surrounds only a part of a portion of the underlying structure. A semiconductor device according to the further aspect of the disclosure includes a pillar-shaped semiconductor, a first insulator surrounding a portion of the pillar-shaped semiconductor at a first end of the pillar-shaped semiconductor, a first metal surrounding the first insulator, a fourth insulator surrounding a portion of the pillar-shaped semiconductor at a second end of the pillar-shaped semiconductor, a second metal surrounding the fourth insulator, a fifth insulator surrounding a portion of the pillar-shaped semiconductor in a region sandwiched between the first metal and the second metal, a third metal surrounding the fifth insulator, a second insulator between the first metal and the third metal, a third insulator between the second metal and the third metal, a fourth metal connecting the first metal and the first end of the pillar-shaped semiconductor, and a fifth metal connecting the second metal and the second end of the pillar-shaped semiconductor.

Charge carriers are induced at first end of the pillar-shaped semiconductor by a difference in the work function between the pillar-shaped semiconductor and the first metal, and charge carriers are induced at the second end of the pillar-shaped semiconductor by a difference in the work function between the pillar-shaped semiconductor and the second metal.

A semiconductor device according to the further aspect of the present invention includes a pillar-shaped semiconductor, a first insulator that surrounds at least a part of a portion of the pillar-shaped semiconductor at a first end of the pillar-shaped semiconductor, a first metal surrounding at least a part of the first insulator, a fourth insulator surrounding at least a part of a portion of the pillar-shaped semiconductor at the second end of the pillar-shaped semiconductor, a second metal surrounding at least a part of the fourth insulator, a fifth insulator surrounding at least a part of a portion of the pillar-shaped semiconductor in a region sandwiched between the first metal and the second metal, a third metal that surrounds at least a part of the fifth insulator, a second insulator between the first metal and the third metal, a third insulator between the second metal and the third metal, a fourth metal that connecting the first metal and the first end of the pillar-shaped semiconductor, and a fifth metal connecting the second metal and the second end of the pillar-shaped semiconductor.

Charge carriers are induced at the first end of the pillar-shaped semiconductor by a difference in the work function between the pillar-shaped semiconductor and the first metal, and charge carriers are induced at the second end of the pillar-shaped semiconductor by a difference in the work function between the pillar-shaped semiconductor and the second metal.

DESCRIPTION OF THE PREFERRED EMBODIMENTS

Figure 1:
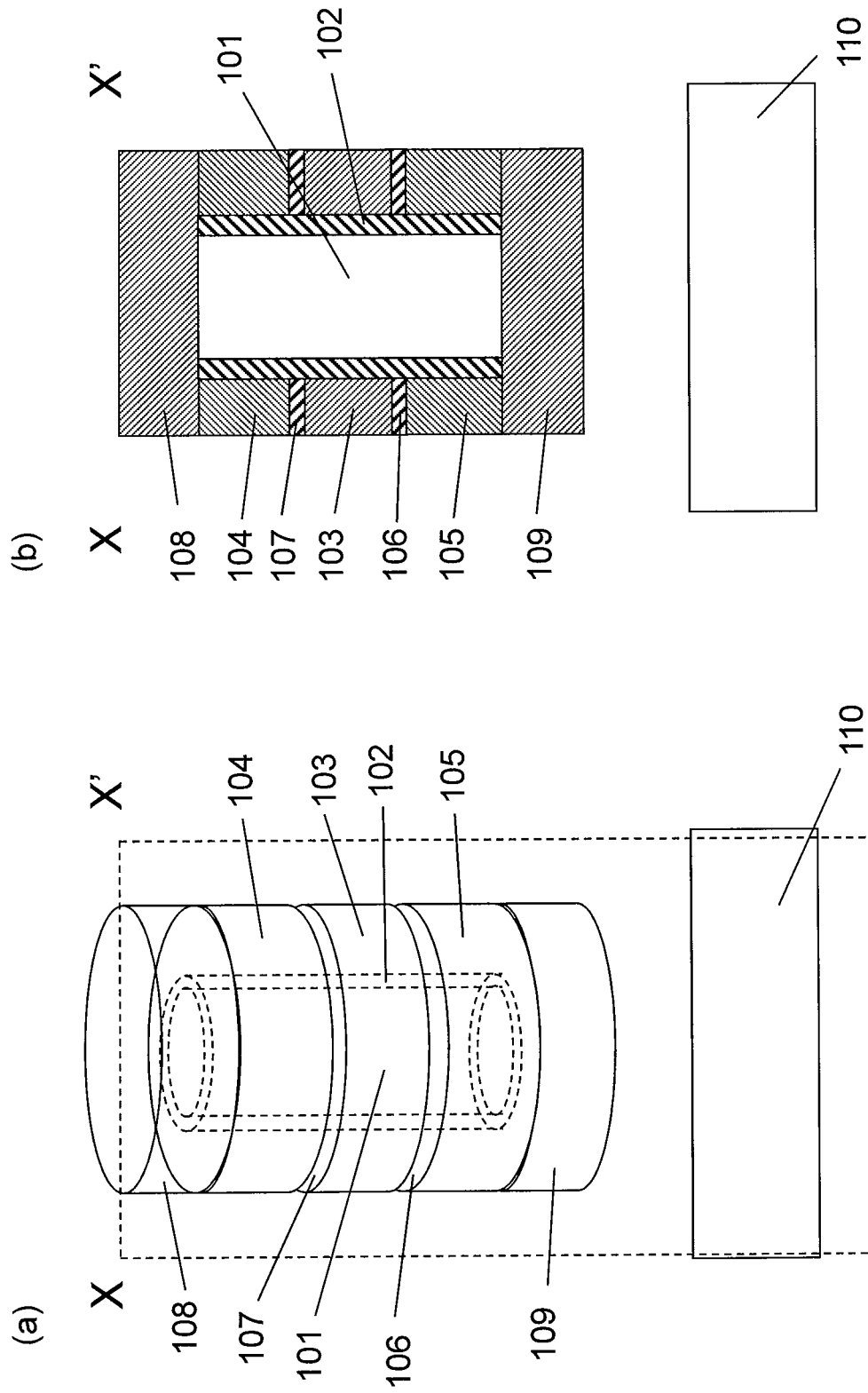
FIG. 1(a) illustrates a perspective view illustrating a semiconductor device according to an embodiment of the disclosure and FIG. 1(b) illustrates a sectional view of the semiconductor device taken along plane X-X' of FIG. 1(a).

A semiconductor device having an SGT structure according to an embodiment of the disclosure will now be described with reference to FIG. 1.

A pillar-shaped silicon 101 having an impurity concentration of $10^{17}$ $cm^{-3}$ or less, a first insulator 102 that surrounds the pillar-shaped silicon 101, a first metal 104 that surrounds a portion of the first insulator 102 at one end of the pillar-shaped silicon 101, a second metal 105 that surrounds a portion of the first insulator 102 at the other end of the pillar-shaped silicon 101, a third metal 103 that surrounds a portion of the first insulator 102 in a region sandwiched between the first metal 104 and the second metal 105, a second insulator 107 formed between the first metal 104 and the third metal 103, a third insulator 106 formed between the second metal 105 and the third metal 103, a fourth metal 108 that connects the first metal 104 and the one end of the pillar-shaped silicon 101, and a fifth metal 109 that connects the second metal 105 and the other end of the pillar-shaped silicon 101 are disposed on a substrate 110. The third metal 103 has a work function of about 4.2 eV to about 5.0 eV.

In operation the same potential is applied to the first metal 104 and first end of the pillar-shaped silicon 101 because of the presence of the fourth metal 108.

Similarly, in operation the same potential is applied to the second metal 105 and the second end of the pillar-shaped silicon 101 because of the presence of the fifth metal 109.

Therefore, charge carriers are induced by a difference in the work function between metal and silicon at the first end and the second end of the pillar-shaped silicon 101.

When the work function of the first metal 104 and the second metal 105 is in the range of about 4.0 eV to about 4.2 eV, which is close to a work function of n-type silicon of 4.05 eV, the first end and the second end of the pillar-shaped silicon 101 function as n-type silicon. The first metal 104 and the second metal 105 are preferably, for example, a compound (TaTi) of tantalum and titanium or tantalum nitride (TaN).

When the work function of the first metal 104 and the second metal 105 is in the range of about 5.0 eV to about 5.2 eV, which is close to a work function of p-type silicon of 5.15 eV, the first end and the second end of the pillar-shaped silicon 101 function as p-type silicon. The first metal 104 and the second metal 105 are preferably, for example, ruthenium (Ru) or titanium nitride (TiN).

In this case, when the work function of the third metal 103 is in the range of about 4.2 eV to about 5.0 eV, the semiconductor device can operate as an enhancement-type transistor.

When the work function of the first metal 104 and the second metal 105 is in the range of about 4.0 eV to about 4.2 eV, which is close to a work function of n-type silicon of 4.05 eV, the first end and the second end of the pillar-shaped silicon 101 function as a source and a drain of an n-type silicon. A portion of the pillar-shaped silicon 101 surrounded by the third metal 103 functions as an intrinsic-type (i-type) silicon, low-concentration n-type silicon, or low-concentration p-type silicon. Thus, an n-type transistor is provided.

When the work function of the first metal 104 and the second metal 105 is in the range of about 5.0 eV to about 5.2 eV, which is close to a work function of p-type silicon of 5.15 eV, the first end and the second end of the pillar-shaped silicon 101 function as a source and a drain of p-type silicon. A portion of the pillar-shaped silicon 101 surrounded by the third metal 103 functions as i-type silicon, low-concentration n-type silicon, or low-concentration p-type silicon. Thus, a p-type transistor is provided.

As described above, transistor operation can be achieved without an impurity present in the pillar-shaped silicon. Therefore, impurity implantation for forming a diffusion layer is not necessary.

Figure 2:
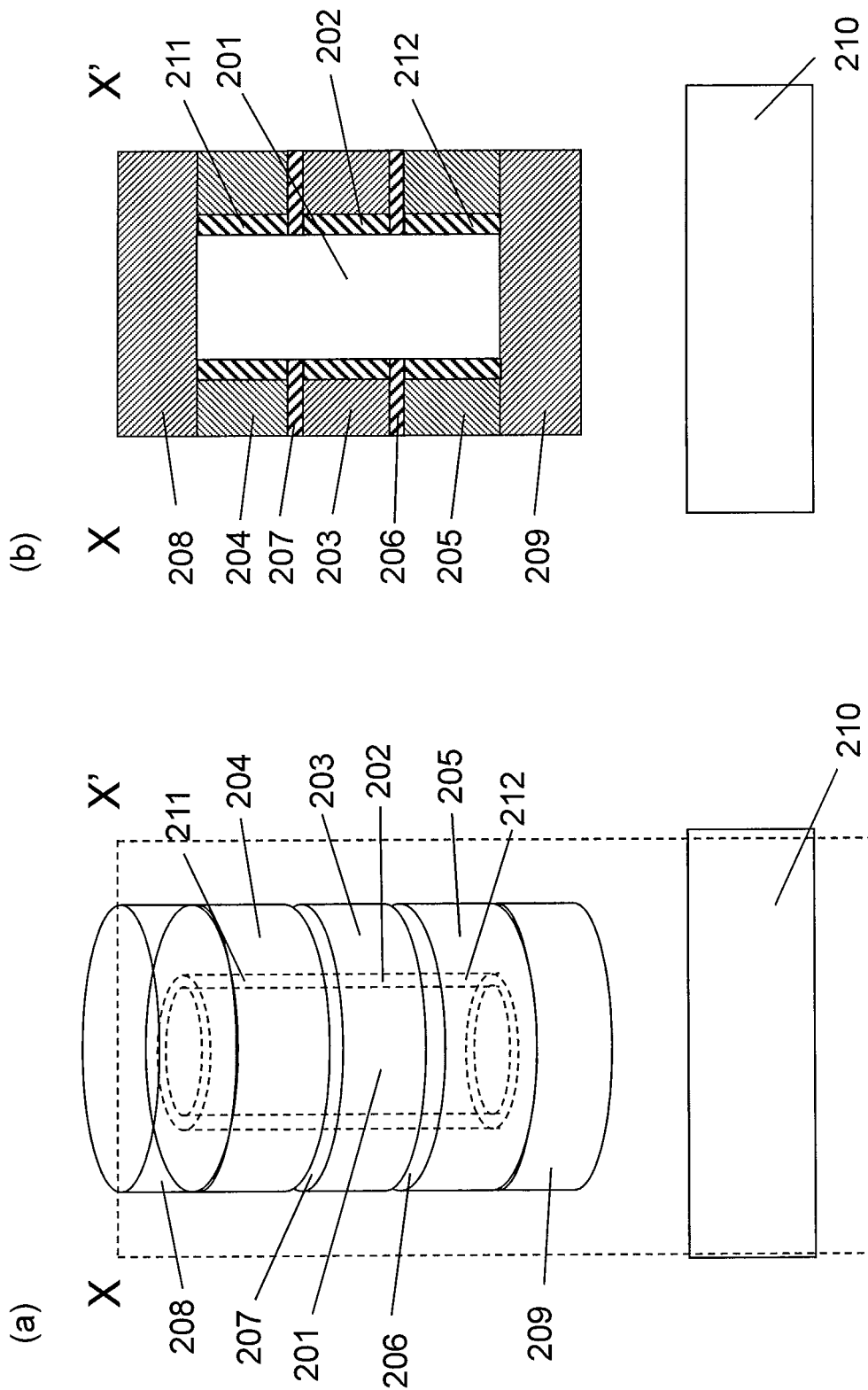
FIG. 2(a) illustrates a perspective view illustrating a semiconductor device according to an embodiment of the disclosure and FIG. 2(b) illustrates a sectional view of the semiconductor device taken along plane X-X' of FIG. 2(a).

A semiconductor device having an SGT structure according to an embodiment of the disclosure will now be described with reference to FIG. 2.

In a pillar-shaped semiconductor 201 disposed on a substrate 210, a first insulator 211 surrounds a portion of the pillar-shaped semiconductor 201 at an end of the pillar-shaped semiconductor 201, a first metal 204 surrounds the first insulator 211, a fourth insulator 212 surrounds a portion of the pillar-shaped semiconductor 201 at the end of the pillar-shaped semiconductor 201, a second metal 205 surrounds the fourth insulator 212, a fifth insulator 202 surrounds a portion of the pillar-shaped semiconductor 201 in a region sandwiched between the first metal 204 and the second metal 205, a third metal 203 surrounds the fifth insulator 202, a second insulator 207 is between the first metal 204 and the third metal 203, a third insulator 206 is between the second metal 205 and the third metal 203, a fourth metal 208 connects the first metal 204 and the one end of the pillar-shaped semiconductor 201, and a fifth metal 209 connects the second metal 205 and the other end of the pillar-shaped semiconductor 201.

Figure 3:
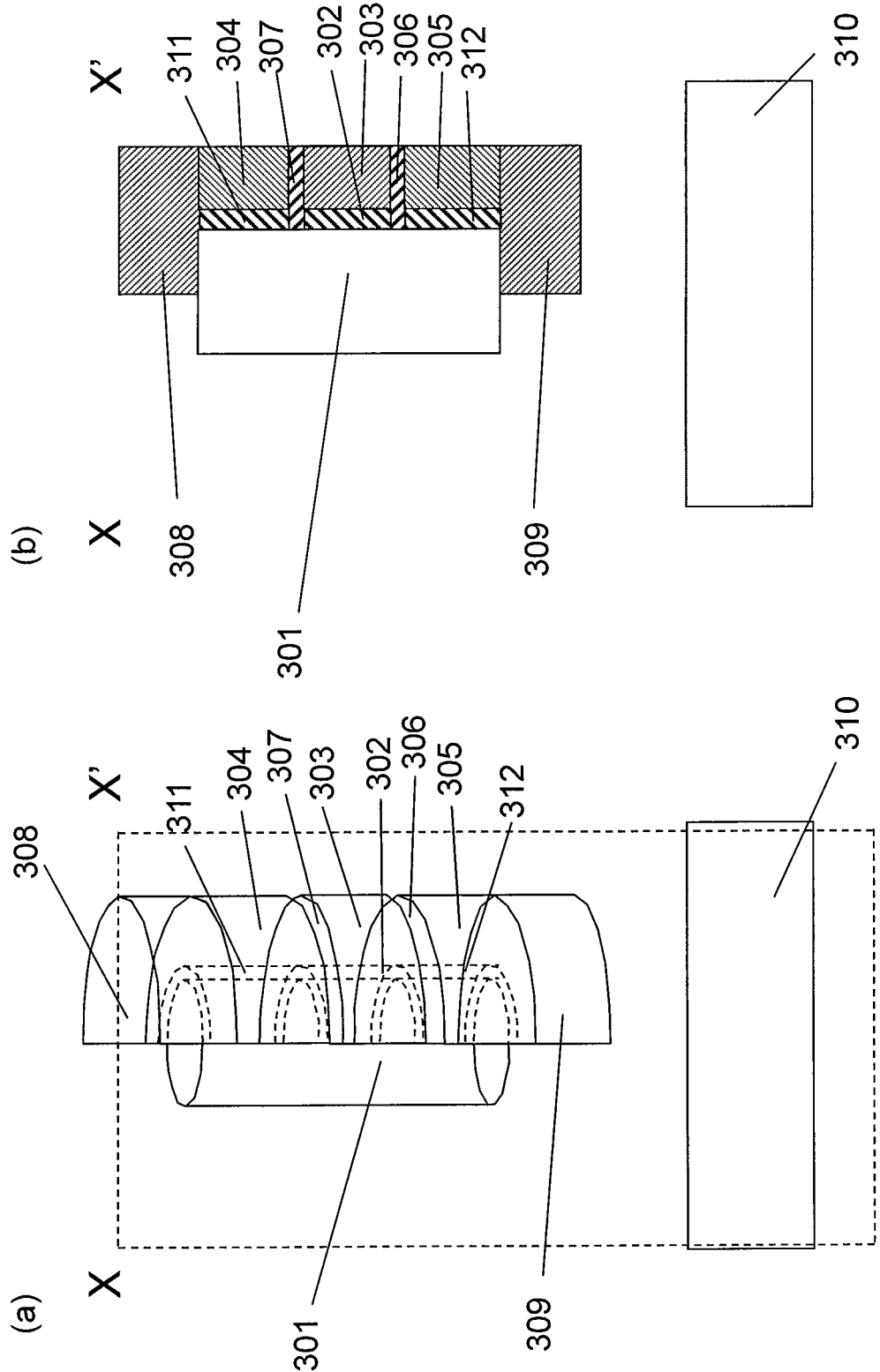
FIG. 3(a) illustrates a perspective view illustrating a semiconductor device according to an embodiment of the disclosure and FIG. 3(b) illustrates a sectional view of the semiconductor device taken along plane X-X' of FIG. 3(a).

A semiconductor device having an SGT structure according to an embodiment of the disclosure will now be described with reference to FIG. 3.

In a pillar-shaped semiconductor 301 disposed on a substrate 310, a first insulator 311 surrounds at least a part of a portion of the pillar-shaped semiconductor 301 at one end of the pillar-shaped semiconductor 301, a first metal 304 surrounds at least a part of the first insulator 311, a fourth insulator 312 surrounds at least a part of a portion of the pillar-shaped semiconductor 301 at the end of the pillar-shaped semiconductor 301, a second metal 305 surrounds at least a part of the fourth insulator 312, a fifth insulator 302 surrounds at least a part of a portion of the pillar-shaped semiconductor 301 in a region sandwiched between the first metal 304 and the second metal 305, a third metal 303 surrounds at least a part of the fifth insulator 302, a second insulator 307 is between the first metal 304 and the third metal 303, a third insulator 306 is between the second metal 305 and the third metal 303, a fourth metal 308 connects the first metal 304 and the first end of the pillar-shaped semiconductor 301, and a fifth metal 309 connects the second metal 305 and the second end of the pillar-shaped semiconductor 301.

In the present invention, various embodiments and modifications can be made without departing from the broad sprit and scope of the present invention. Furthermore, the above-described embodiment is provided to describe one embodiment of the present invention, and the scope of the present invention is not limited thereto.

The invention claimed is:

1. A semiconductor device comprising:
a pillar-shaped semiconductor having an impurity concentration of $10^{17}$ cm$^{-3}$ or less;
a first insulator surrounding the pillar-shaped semiconductor;
a first metal surrounding a portion of the first insulator at a first end of the pillar-shaped semiconductor;
a second metal surrounding a portion of the first insulator at a second end of the pillar-shaped semiconductor;
a third metal surrounding a portion of the first insulator in a region sandwiched between the first metal and the second metal;
a second insulator between the first metal and the third metal;
a third insulator between the second metal and the third metal;
a fourth metal connecting the first metal and the first end of the pillar-shaped semiconductor; and
a fifth metal connecting the second metal and the second end of the pillar-shaped semiconductor,
wherein the third metal has a work function of about 4.2 eV to about 5.0 eV.

2. The semiconductor device according to claim 1, wherein the semiconductor comprises silicon.

3. The semiconductor device according to claim 2, wherein the first metal and the second metal have a work function of about 4.0 eV to about 4.2 eV.

4. The semiconductor device according to claim 2, wherein the first metal and the second metal have a work function of about 5.0 eV to about 5.2 eV.

5. A semiconductor device comprising:
a pillar-shaped semiconductor;
a first insulator surrounding the pillar-shaped semiconductor;
a first metal surrounding a portion of the first insulator at a first end of the pillar-shaped semiconductor;
a second metal surrounding a portion of the first insulator at a second end of the pillar-shaped semiconductor;
a third metal surrounding a portion of the first insulator in a region sandwiched between the first metal and the second metal;
a second insulator between the first metal and the third metal;
a third insulator between the second metal and the third metal;
a fourth metal connecting the first metal and the first end of the pillar-shaped semiconductor; and
a fifth metal connecting the second metal and a second end of the pillar-shaped semiconductor.

6. The semiconductor device according to claim 5, wherein charge carriers are induced at the first end of the pillar-shaped semiconductor by a difference in a work function between the pillar-shaped semiconductor and the first metal, and carriers are induced at the second end of the pillar-shaped semiconductor by a difference in the work function between the pillar-shaped semiconductor and the second metal.

7. A semiconductor device comprising:
a pillar-shaped semiconductor;
a first insulator surrounding a portion of the pillar-shaped semiconductor at end of the pillar-shaped semiconductor;
a first metal surrounding the first insulator;
a fourth insulator surrounding a portion of the pillar-shaped semiconductor at the end of the pillar-shaped semiconductor;
a second metal surrounding the fourth insulator;
a fifth insulator surrounding a portion of the pillar-shaped semiconductor in a region sandwiched between the first metal and the second metal;
a third metal surrounding the fifth insulator;
a second insulator between the first metal and the third metal;
a third insulator between the second metal and the third metal;
a fourth metal connecting the first metal and the one end of the pillar-shaped semiconductor; and
a fifth metal connecting the second metal and the other end of the pillar-shaped semiconductor.

8. The semiconductor device according to claim 7, wherein charge carriers are induced at the first end of the pillar-shaped semiconductor by a difference in a work function between the pillar-shaped semiconductor and the first metal, and charge carriers are induced at the second end of the pillar-shaped semiconductor by a difference in a work function between the pillar-shaped semiconductor and the second metal.

9. A semiconductor device comprising:
a pillar-shaped semiconductor;
a first insulator surrounding at least a part of a portion of the pillar-shaped semiconductor at one end of the pillar-shaped semiconductor;
a first metal surrounding at least a part of the first insulator;
a fourth insulator surrounding at least a part of a portion of the pillar-shaped semiconductor at the end of the pillar-shaped semiconductor;
a second metal surrounding at least a part of the fourth insulator;
a fifth insulator surrounding at least a part of a portion of the pillar-shaped semiconductor in a region sandwiched between the first metal and the second metal;
a third metal surrounding at least a part of the fifth insulator;
a second insulator between the first metal and the third metal;
a third insulator between the second metal and the third metal;
a fourth metal connecting the first metal and the first end of the pillar-shaped semiconductor; and
a fifth metal connecting the second metal and the second end of the pillar-shaped semiconductor.

10. The semiconductor device according to claim 9, wherein charge carriers are induced at the first end of the pillar-shaped semiconductor by a difference in a work function between the pillar-shaped semiconductor and the first metal, and charge carriers are induced at the second end of the pillar-shaped semiconductor by a difference in a work function between the pillar-shaped semiconductor and the second metal.

* * * * *

UNITED STATES PATENT AND TRADEMARK OFFICE
CERTIFICATE OF CORRECTION

PATENT NO.        : 9,024,376 B2
APPLICATION NO.   : 14/160788
DATED             : May 5, 2015
INVENTOR(S)       : Fujio Masuoka et al.

It is certified that error appears in the above-identified patent and that said Letters Patent is hereby corrected as shown below:

<u>In the Claims</u>

In column 6, claim 5, line 32, after "the second metal and" replace "a" with --the--.

In column 6, claim 7, line 44, after "semiconductor at" insert --a first--.

In column 6, claim 7, line 48, before "end of the pillar-shaped" replace "the" with --a second--.

In column 6, claim 7, line 59, after "metal and the" replace "one" with --first--.

In column 6, claim 7, line 61, after "second metal and the" replace "other" with --second--.

In column 7, claim 9, line 6, after "semiconductor at" replace "one" with --a first--.

In column 7, claim 9, line 10, after "semiconductor at" replace "the" with --a second--.

In column 7, claim 9, line 10, after "semiconductor at" replace "the" with --a second--.

Signed and Sealed this
Fifth Day of April, 2016

Michelle K. Lee
*Director of the United States Patent and Trademark Office*